US008040681B2

(12) United States Patent
Golberg et al.

(10) Patent No.: US 8,040,681 B2
(45) Date of Patent: Oct. 18, 2011

(54) CIRCUIT ARRANGEMENT

(75) Inventors: Hans-Joachim Golberg, Ulm (DE); Reinhard Oelmaier, Laupheim (DE)

(73) Assignee: Atmel Corporation, San Jose, CA (US)

(*) Notice: Subject to any disclaimer, the term of this patent is extended or adjusted under 35 U.S.C. 154(b) by 834 days.

(21) Appl. No.: 11/850,657

(22) Filed: Sep. 5, 2007

(65) Prior Publication Data
US 2008/0074855 A1    Mar. 27, 2008

Related U.S. Application Data

(60) Provisional application No. 60/842,040, filed on Sep. 5, 2006.

(51) Int. Cl.
*H05K 7/00*    (2006.01)

(52) U.S. Cl. ........................ 361/782; 361/736

(58) Field of Classification Search .............. 361/782, 361/705, 720, 748, 760, 679.01, 688, 704; 257/678, 701, 706, 707; 174/547, 50, 520
See application file for complete search history.

(56) References Cited

U.S. PATENT DOCUMENTS

2005/0093760 A1*  5/2005  Rochelle et al. ............. 343/867
* cited by examiner

*Primary Examiner* — Hung S Bui
(74) *Attorney, Agent, or Firm* — Baker Botts L.L.P.

(57) ABSTRACT

A circuit arrangement is provided that includes at least one semiconductor component, at least one filter arrangement, which has at least two discretely made coil elements, which are disposed adjacent to one another with parallel aligned magnetic field axes, and a contacting unit, which has electrical traces for an electrically conductive connection of the semiconductor component to the filter arrangement. A thickness of the semiconductor component is at least 20% of a thickness of the coil elements.

21 Claims, 2 Drawing Sheets

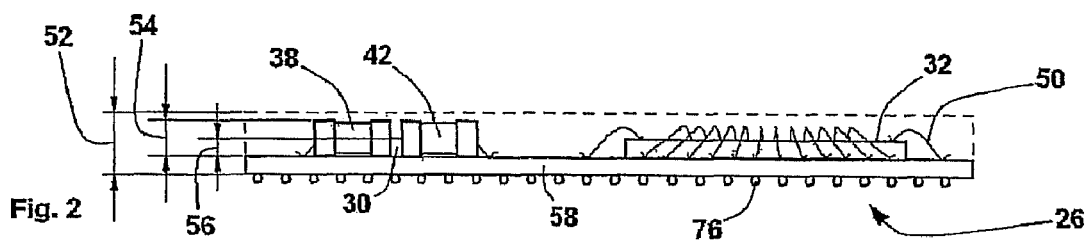
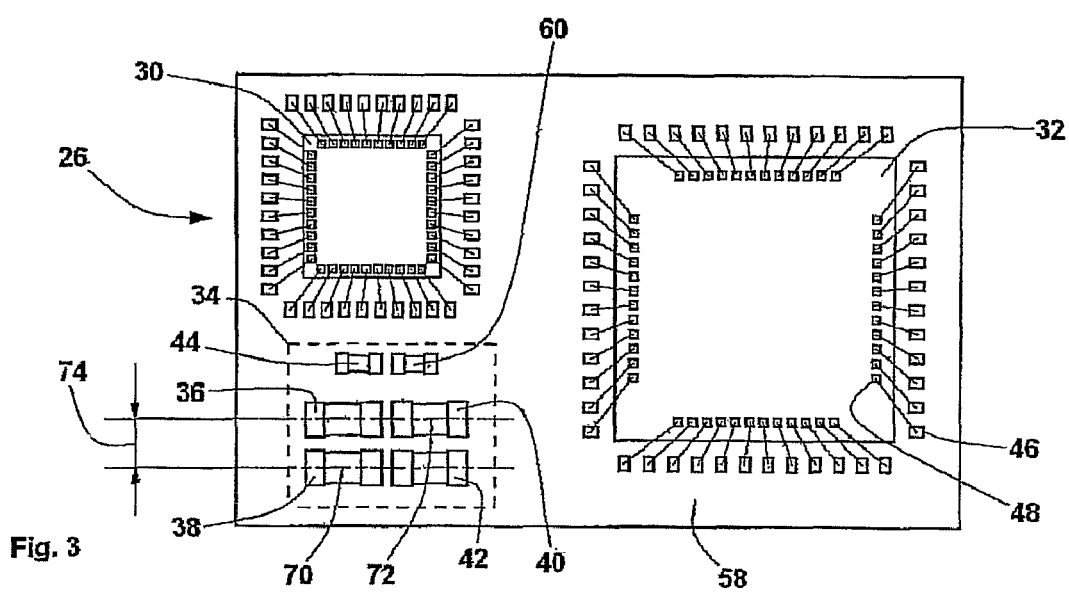
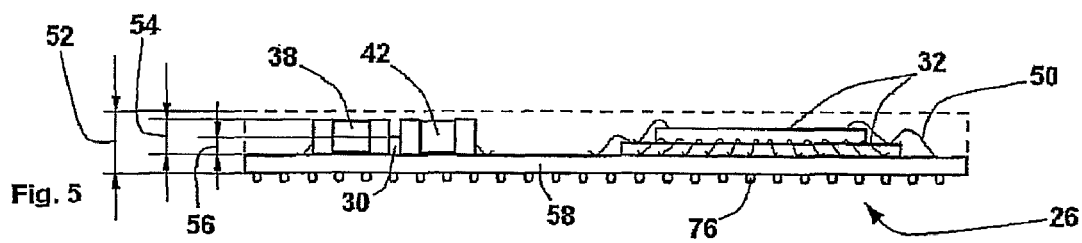

CIRCUIT ARRANGEMENT

This nonprovisional application claims priority to U.S. Provisional Application No. 60/842,040, which was filed on Sep. 5, 2006, and is herein incorporated by reference.

BACKGROUND OF THE INVENTION

1. Field of the Invention

The present invention relates to a circuit arrangement comprising at least one semiconductor component and at least one filter arrangement, which has at least two discretely made coil elements, which are disposed adjacent to one another with parallel-aligned magnetic field axes, and a contacting unit, which has electrical traces for an electrically conductive connection of the semiconductor component to the filter arrangement.

2. Description of the Background Art

A circuit arrangement, known from being commercially available, is set up for the receipt and processing of high-frequency electromagnetic signals, which are emitted, for example, by satellites in orbit, and is called a receiver for a global positioning system (global positioning system receiver or GPS receiver). The task of the circuit arrangement is substantially to process the encoded signals from satellites in such a way that position and/or time and/or speed signals can be made available for further processing, for example, by a navigation system. The satellite signals are typically very weak signals, which the GPS receiver must greatly amplify. Because signal processing with the fewest interferences possible is to be the aim for precise position sensing, the received signals are filtered during processing with the use of filter arrangements. Filter arrangements of this type can be designed as bandpass filters and have coil elements, which have different, predefinable attenuations for signals with different frequencies.

In a conventional GPS receiver, the circuit arrangement has a contacting unit, which is provided for an electrical connection of the semiconductor component to the filter arrangement. This type of contacting unit is also called a circuit board or printed circuit and frequently is formed of glass fiber-reinforced epoxy resin. At least one discretely designed, housed semiconductor component and discretely designed components for the filter arrangement are placed on the contacting unit. The components for the filter arrangement are typically made as components that can be mounted on surfaces (surface mount devices/SMD), which are placed on the surface of the contacting unit and are connected to the contacting unit particularly with the use of a conductive adhesive or silk-screenable solder paste. Wound metal wire coils are used as coil elements for the filter arrangement. A magnetic field flows through the coil elements when an electrical voltage is applied. The magnetic field within the coil is aligned in the direction of a magnetic field axis, which is disposed concentrically to a center axis of an outer cylinder around the coil. The adjacently disposed coil elements of the filter arrangement are aligned relative to each other in such a way that the magnetic field axes lie parallel to one another.

SUMMARY OF THE INVENTION

It is therefore an object of the present invention to provide a circuit arrangement with a compact design.

The circuit arrangement according to an embodiment is thereby designed in such a way that the semiconductor component is placed without a housing on the contacting unit and a thickness of the semiconductor component is at least 20% of a thickness of the coil elements. The semiconductor component is thereby placed without a housing on the contacting unit and contacted electrically with the traces. In other words, the housing-free semiconductor component, which is also called the semiconductor die and has a silicon substrate with a layer structure placed thereon, is preferably placed firmly bonded on the contacting unit. Within the meaning of the application, the term semiconductor component also comprises semiconductor structural element groups, therefore a plurality of housing-free semiconductor structural elements placed flat on one another, so-called die stacks. Such semiconductor component groups can be realized with semiconductor components, made especially thin. Contact areas of the semiconductor component, so-called contact pads, are preferably connected in an electrically conductive manner by thin gold wires, so-called bond wires, to contact areas of the contacting unit. The structural elements of the filter arrangement, particularly the coil elements, are selected based on a thickness of the semiconductor component, therefore based on an extension of the semiconductor component in the normal direction to the contacting unit surface, in such a way that a thickness of the structural elements is less than double the thickness of the semiconductor component. For reasons of cost, the semiconductor component is typically selected as thin and thus has a low thickness, in order to save substrate material. To fulfill the aforementioned condition in regard to the thickness relationships of the semiconductor component and filter arrangement, the coil elements must also have a small thickness. In this way, an especially compact design of the circuit arrangement can be achieved. An especially cost-effective thickness range for a semiconductor component is within a range of 0.35 mm to 0.5 mm. Thus, the relation between the thickness of the semiconductor component and the coil component can be expressed in such a way that the thickness of the semiconductor component is at least 50% of the thickness of the coil component.

An embodiment of the invention provides that the filter arrangement and the at least one semiconductor component are housed in a common, form-stable covering. In this way, an advantageous protection against environmental conditions such as dirt or moisture can be assured.

An embodiment of the invention provides that the coil elements are disposed with a spacing that corresponds to 1.5 times to 2.5 times, preferably 2 times, the thickness of the coil elements. The distance between the center axes of neighboring coil elements is regarded as the spacing. An arrangement of the coil elements with a spacing that corresponds to 1.5 times to 2.5 times the thickness of the coil elements, in regard to the inductance of the coil elements, means that the coil elements mutually influence each other. In other words, a desirable inductive interaction between the coil elements in their magnetic near field occurs. When an electrical voltage is applied to the coil elements, the center axes of the coil elements correspond at least substantially to the magnetic field axes. The coil elements can have a substantially square cross section in a cross-section level orthogonal to the center axis, because the cylindrically shaped coils are surrounded by a closely adjacent, substantially rectangular SMD housing. Thereby, the thickness of the coil elements also corresponds to their width and is determined by the winding diameter of the coil. A length of the coil elements is determined substantially by a winding spacing, wire thickness, and the number of windings. An advantageous embodiment of the invention provides a spacing of 0.85 mm to 0.9 mm between the coil elements. Using this spacing, it is possible to achieve an especially advantageous mutual coupling between the coil elements for the frequency range relevant for the processing of GPS signals.

A further embodiment of the invention provides that the coil elements are disposed in-phase for electrical and magnetic coupling. The coil elements are disposed adjacently and aligned to one another with parallel magnetic axes. This results in a mutually inductive interaction in the near field, particularly due to mutual coupling of the coil elements. This inductive interaction can be utilized especially advantageously, when the coil elements are connected magnetically in-phase, so that an increase in the inductance for the adjacent coil elements can be realized. Thus, coils with a lower inductance can be used, as would be the case without the mutual influence of the coil elements in the near field. The coil elements can have a rather small height, particularly thickness, and enable a more compact integration of the filter arrangement into the circuit arrangement.

In a further embodiment of the invention, it is provided that the at least one semiconductor component and the filter arrangement are housed in a common covering made of a curable plastic. Thus, the at least one semiconductor component and the filter arrangement together with the contacting unit, which is also called the substrate or support, form a discrete structural element, which is fabricated ready-to-use and can be integrated into an electronic circuit in a simple manner. In this case, the curable plastic has the task of protecting the semiconductor component and the filter arrangement from environmental effects such as moisture or dirt and simultaneously forming a robust, form-stable network of semiconductor component, filter arrangement, and contacting unit. Two-component epoxy resin mixtures may be used in particular as curable plastics.

Another embodiment of the invention provides that at least one semiconductor component is configured to process signals of a satellite navigation system. The semiconductor component makes it possible, for example, to receive and decode different signals from satellites of the satellite navigation system and to determine the position coordinates from the evaluation of the decoded satellite signals.

It is provided in a further embodiment of the invention that the filter arrangement has coupling capacitors, which are assigned to the coil elements. The filter arrangement can thereby be made as a resonant circuit, in which depending on the frequency of the signal to be filtered a predefinable signal attenuation occurs with the use of capacitors or inductors, i.e., the coil elements.

A further embodiment of the invention provides that the filter arrangement has two parallel-connected resonant circuits. The two resonant circuits are provided for filtering different signals, but benefit from each other by the mutual coupling of the coil elements in the near field. A resonance frequency for the two resonant circuits can be preset at 100 MHz, as a result of which preferably filtering of signals of a satellite navigation system can be performed.

Another embodiment of the invention provides that the filter arrangement is designed as an intermediate frequency filter. The intermediate frequency filter permits a narrow frequency band around the intermediate frequency to pass virtually unimpeded, but all other frequency ranges are greatly damped. The intermediate frequency filter should block off signals as the band pass outside a predefined frequency range and allow frequencies within the predefined frequency range to pass through as unimpeded and unchanged as possible. A bandwidth of the intermediate frequency filter, therefore a frequency range in which the intermediate frequency filter is passable, is influenced by the inductive coupling of the coil elements. With a greater distance of the coil elements, a lower bandwidth of the filter arises, whereas with a smaller distance there is a greater filter bandwidth. With the use of small, compact structural elements for the coil elements, the bandwidth of the intermediate frequency filter can be changed by varying the spacing, thus the distances of the center axes of the coil elements, within a broad range of up to 5% of the resonance frequency.

A further embodiment of the invention provides that the filter arrangement comprises two parallel rows of several coil elements. An addition of the inductances of the coil elements connected in series is achieved in this way, so that by stringing together of coil structural elements the desired inductance value can be achieved with use of standard coil elements. The inductances for the resonant circuits are thereby influenced by the series connection of several coil elements and by the inductive interaction of adjacent coil elements aligned parallel to one another. This makes possible an especially compact design of the filter arrangement.

A further embodiment of the invention provides that the coupling capacitors are made integrated at least partially on the semiconductor component. An especially compact design of the filter arrangement and thereby of the circuit arrangement can be achieved by integrating coupling capacitors on the semiconductor component, because no additional space on the contacting unit is required at least for part of the capacitors, which form the resonant circuit with the coil elements. Moreover, the capacitors can be ideally adjusted to the filter frequencies of the filter arrangement by a suitable layout of the semiconductor component. It is thereby possible to accommodate large capacitors, designed as standard structural elements, for the resonant circuits on the contacting unit, whereas an adjustment of the capacities for the resonant circuits is carried out with use of capacitors on the semiconductor component. In an especially preferred embodiment, the capacitors can be made adjustable or trimmable on the semiconductor component, so that a function test can be performed after the construction of the circuit arrangement. Within the scope of the function test, the capacitors can be adjusted on the semiconductor component, particularly by laser trimming, to perform an especially advantageous frequency adjustment for the filter arrangement.

It is provided in another embodiment of the invention that the thickness of the semiconductor component is selected within a range between 0.05 mm and 0.5 mm. In this case, this is a thickness of a semiconductor component without a housing, which preferably has a layer structure on a silicon substrate.

It is provided in another embodiment of the invention that the thickness of the coil elements is selected within a range between 0.3 mm and 0.75 mm. Thereby, for example, structural elements of type 0402 (4/10 inches long=1.00 mm; 2/10 inches wide or thick=0.5 mm) are used for the construction of the circuit arrangement. Therefore, the coil elements with respect to their thickness are within a range that differs little from the range in which the thickness of the semiconductor components occurs, so that coil elements have little effect on the thickness of the circuit arrangement. Only this especially favorable relationship between the thickness of the coil elements and the thickness of the semiconductor components makes possible a construction of the filter arrangement and the semiconductor components on a common contacting unit and therefore the compact design of the circuit arrangement according to the invention.

A further embodiment of the invention provides that a total thickness of the contacting unit with the coil elements and the curable plastic material is less than 1.5 mm. As a result, an advantageous integration of the circuit arrangement into compact, portable devices such as cell phones, personal digital assistants (PDAs), GPS receivers, etc., is achieved. It is especially preferable for the total thickness of the circuit arrangement to be less than 1.2 mm.

Another embodiment of the invention provides that the contacting unit at a surface facing away from the semiconductor component and the filter arrangement has several electrical contact areas, which are designed for a ball grid array (BGA). As a result, the circuit arrangement, which is also called a multi-chip module if several semiconductor components are present on the contacting arrangement, can be connected with a compact and reliable bonding technique to a printed circuit board of an electronic device. The contacting device is provided for this purpose on the surface facing away from the semiconductor component with a plurality of contact areas preferably disposed in a grid array. Solder balls of preferably lead-free solder are applied to the contact areas. These solder balls can then again be melted in a subsequent work step, to enable electrical connections to a printed circuit board.

The circuit arrangement therefore has at least one semiconductor component and at least one filter arrangement, which is realized with at least two capacitors and at least two discretely made coil elements, whereby the coil elements are arranged adjacent to one another with parallel-aligned magnetic field axes; as well as a contacting unit, which has electrical traces for an electrically conductive connection of the semiconductor component to the filter arrangement. The filter arrangement comprises at least two resonant circuits, coupled in-phase electrically and magnetically, which are assigned to electrical terminals of the semiconductor component, whereby a thickness of the circuit arrangement is less than 2 mm, especially preferably less than 1.6 mm.

In another embodiment of the invention, a circuit arrangement is provided comprising at least one semiconductor component, at least one filter arrangement, which has at least two discretely made coil elements, which are disposed adjacent to one another with parallel-aligned magnetic field axes, and a contacting unit, which has electrical traces for an electrically conductive connection of the semiconductor component to the filter arrangement. In this case, the semiconductor component is placed without a housing on the contacting unit and the coil elements are disposed with a spacing that corresponds to 1 times to 2.5 times, preferably 1.5 times, a width of the coil elements. An advantageous mutual coupling of the coil elements can be realized thereby. It is provided in an advantageous embodiment of the invention that the coil elements are disposed with a spacing, therefore with a distance of the magnetic axes of 0.75 mm. Moreover, an especially compact design of the circuit arrangement is possible because of the use of a housing-free semiconductor component. The thickness of the semiconductor component can vary thereby within a range of 0.1 mm to 0.5 mm. Several semiconductor structural elements can be disposed flat one on top of another and form a die stack. In this case, it can be provided preferably that the semiconductor structural element or die stack has a thickness that is at least 20% of the thickness of the coil elements. Other advantageous features can be derived from the subsequent claims 2 to 14, which also apply to this embodiment in a suitable manner.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 2 is a schematic detail drawing of the circuit arrangement of FIG. 1 with two semiconductor components and a filter arrangement in an anterior view, FIG. 3 illustrates the circuit arrangement of FIG. 2 in a plan view, FIG. 5 illustrates another embodiment of the circuit arrangement of FIG. 1 with a semiconductor component and a semiconductor component group.

DETAILED DESCRIPTION

Figure 1:
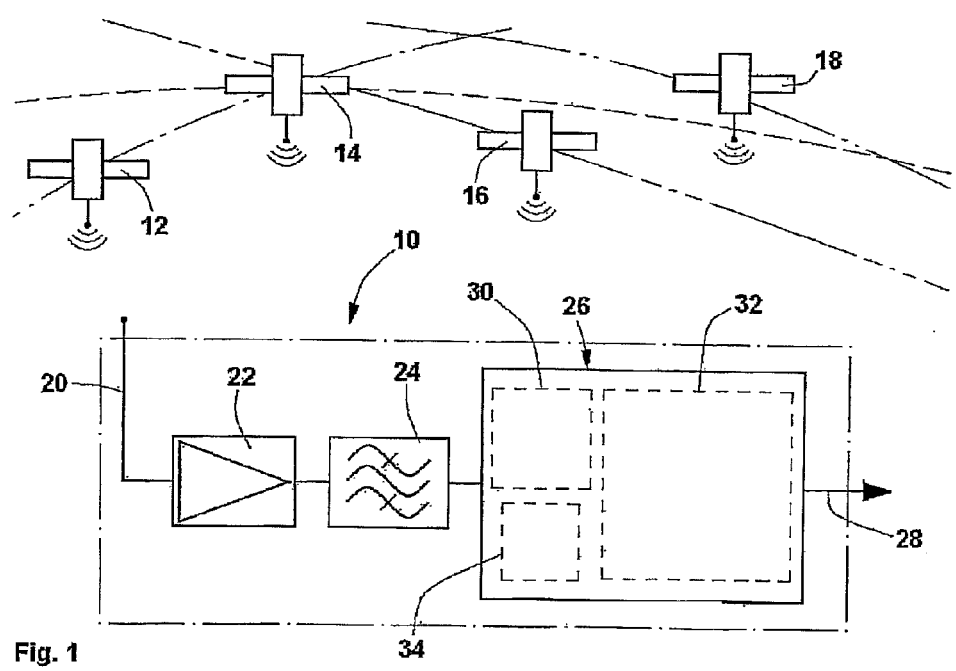
FIG. 1 is a schematic diagram of a circuit arrangement, which is provided for use in a satellite navigation system.

FIG. 1 schematically shows a GPS receiver unit 10, which is provided for receiving of signals of several satellites 12 to 18, which are located in different orbits. Satellites 12 to 18 emit encoded signals, which can be differentiated from one another, are typically transmitted at a frequency of 1.575 GHz, and can be received by an antenna 20 of GPS receiver unit 10. Antenna 20 is connected to a low-noise amplifier 22 (LNA), which amplifies the weak signals of satellites 12 to 18 and is set up in such a way that it does not cause the deterioration of the signal-to-noise ratio of the satellite signal or causes only a slight deterioration. The amplified satellite signal is filtered with the use of a surface acoustic wave filter 24 (SAW filter), which acts as a bandpass filter, and is then relayed further as an input signal for a receiver/multi-chip module 26. Receiver/multi-chip module 26 has a radio frequency semiconductor component or RF chip 30, which is provided for conditioning the input signal. Provided furthermore on the receiver/multi-chip module 26 is a digital semiconductor component or digital chip 32, which performs the further processing of the conditioned input signal. RF chip 30 is assigned a filter arrangement 34 made predominantly of discrete structural elements and shown in greater detail in FIGS. 2 and 3, which is provided for intermediate frequency filtering of the input signal to be conditioned by RF chip 30. After processing in digital chip 32, an output signal 28 is provided by the receiver/multi-chip module, which can be provided for further processing by electronic circuits, which are not shown. Output signal 28 can contain in particular position and/or time and/or speed information, which is obtained with use of the GPS receiver unit from the different signals from satellites 12 to 18.

The construction of the multi-chip/receiver module 26 is shown in greater detail in FIGS. 2 and 3. Two semiconductor components, which are made as RF chip 30 and as digital chip 32, are placed on a printed circuit board 58, which is made as a contacting unit of organic material. Both semiconductor components 30, 32 are made without a housing and have a support substrate, not shown in greater detail, and also a layer structure which is applied to the support substrate and not shown in greater detail. Both semiconductor components 30, 32, on the surface facing away from printed circuit board 58, have a plurality of metallized bond pads 48, which are provided for electrical connections to contact areas 46 of printed circuit board 58. These electrical connections between bond pads 48 and contact areas 46 are shown with bond wires 50, which are made of gold or aluminum wire and are guided in an arc, the so-called bond loop, over semiconductor components 30, 32. Semiconductor components 30, 32 have a thickness 56 of about 0.35 mm; in other words, they extend 35/100 mm upward in a direction normal to the surface of printed board circuit 58, on which semiconductor components 30, 32 are placed. The height of the bond loops of bond wires 50, a height which is not described in greater detail, above semiconductor components 30, 32 is approximately 1/10 mm.

The filter arrangement also provided in the receiver/multi-chip module 26, therefore on common printed circuit board 58, has four coil elements made as coils 36 to 42 or inductors. Coils 36 to 42 are made as SMD components of size 0402 and thereby have a thickness 54 of about 0.5 mm, a width of about 0.5 mm, and a length of about 1 mm. At the end side, coils 36 to 42 are provided with metallized end caps for soldering to the printed circuit board 58. In the substantially rectangular coils 36 to 42, cylindrically formed wire filaments, which are not shown in greater detail, are provided, which are electrically connected to the end caps. The center axes of the wire filaments are drawn as magnetic axes 70 and 72. Magnetic axes 70 and 72 also indicate the alignment of the magnetic field in coils 36 to 42.

Coils 36 to 42 are each connected in pairs in series and disposed adjacent to one another with magnetic axes 70, 72 aligned parallel to one another. A spacing 74, therefore a distance between the magnetic axes, is selected as about 0.85 mm to 0.9 mm, so that when an electrical voltage is applied to the coils in each case a magnetic field is formed in the direction of magnetic axes 70, 72 and a mutual coupling of inductors 36 to 42 is assured by the small distance of coils 36 to 42.

Figure 4:
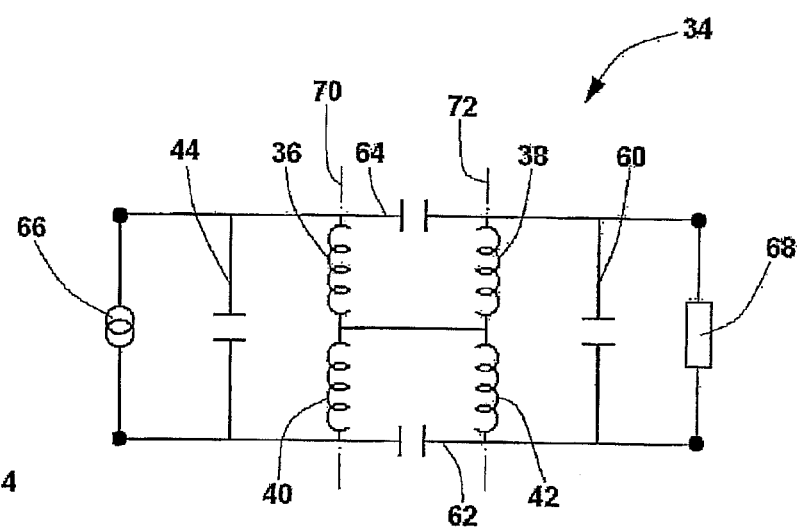
FIG. 4 is an equivalent electrical circuit for the filter arrangement of FIG. 2.

The series-connected coils 36 and 40 according to the drawing in FIG. 4 are connected parallel to a capacitor 44, which is realized as a discrete structural element and thereby forms a first resonant circuit. The series-connected coils 38 and 42 are connected parallel to capacitor 60, likewise realized as a discrete structural element, and form a second resonant circuit. Thereby, coils 36 to 42 and capacitors 44, 60 form two resonant circuits connected in-phase electrically and magnetically, which serve as an intermediate frequency filter for RF chip 30.

The two resonant circuits are each coupled together by coupling capacitors 62 and 64, which are each realized on RF chip 30. Whereas the first resonant circuit is assigned a current source 66 of RF chip 30, the second resonant circuit is assigned a current drain of RF chip 30.

As shown in FIG. 2, a coating, shown only in dotted form, of a curable plastic material is applied over semiconductor components 30, 32 and filter arrangement 34 after placement on the printed circuit board. The total thickness 52 of the circuit arrangement is therefore about 1.2 mm. On the bottom of printed circuit board 58, facing away from semiconductor components 30, 32 and filter arrangement 34, a plurality of solder balls 76, arranged in a grid array, are provided for an electrically conductive attachment to another printed circuit board, which is not shown. Thereby, printed circuit board 58, semiconductor components 30, 32, and filter arrangement 34 form an extremely flat, fabricated ready-to-use, and advantageously tuned receiver/multi-chip module 26, which can be provided preferably for use in portable GPS receiver systems such as cell phones or in navigation systems, particularly for vehicles, for pedestrians, or for cyclists.

The embodiment of FIG. 5 differs from the embodiment of FIG. 2 in that in addition to semiconductor component 30 several semiconductor components 32 are also provided, which form a semiconductor component group or die stack. The total thickness 56 of the semiconductor component group is at least 20% of thickness 54 of the filter arrangement. Furthermore, coil components 16 are arranged with a spacing corresponding to 1.5 times the width of the coil elements.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A circuit comprising:
   at least one semiconductor component;
   at least one filter comprising two parallel-coupled resonant circuits, the resonant circuits comprising at least two discrete coil elements that each has a thickness and are disposed adjacent to one another with parallel-aligned magnetic field axes; and
   a contacting unit comprising electrical traces providing an electrically conductive connection of the semiconductor component to the filter, the semiconductor component residing without a housing on the contacting unit, a thickness of the semiconductor component being at least approximately 20% of the thickness of the coil elements, the filter and the semiconductor component being housed in a common, form-stable covering.

2. The circuit of claim 1, wherein the coil elements are disposed with a spacing from each other of approximately 1.5 times to 2.5 times the thickness of the coil elements.

3. The circuit of claim 1, wherein the coil elements are disposed for in-phase electrical and magnetic coupling.

4. The circuit of claim 1, wherein the common, form-stable covering comprises a curable plastic.

5. The circuit of claim 1, wherein at least one of the at least one semiconductor component is configured to process signals of a satellite navigation system.

6. The circuit of claim 1, wherein the filter comprises coupling capacitors assigned to the coil elements.

7. The circuit of claim 6, wherein the coupling capacitors are integrated at least partially on the semiconductor component.

8. The circuit of claim 1, wherein the filter is an intermediate frequency filter.

9. The circuit of claim 1, wherein the filter comprises two parallel rows of several coil elements.

10. The circuit of claim 1, wherein the thickness of the semiconductor component is between approximately 0.05 mm and approximately 0.5 mm.

11. The circuit of claim 1, wherein the thickness of the coil elements is between approximately 0.3 mm and approximately 0.75 mm.

12. The circuit of claim 1, wherein a total thickness of the contacting unit with the coil elements and the common, form-stable covering is less than approximately 1.5 mm.

13. The circuit of claim 1, wherein:
   the contacting unit is arranged on a surface facing away from the semiconductor component; and
   the filter comprises several electrical contact areas for a ball grid array.

14. The circuit of claim 1, wherein each coil element is a surface-mount device.

15. A circuit comprising:
   at least one semiconductor component;
   at least one filter comprising at least two parallel-coupled resonant circuits, the resonant circuits comprising at least two capacitors and at least two discrete coil elements, the resonant circuits being disposed adjacent to one another with parallel aligned magnetic field axes and being coupled to each other in-phase electrically and magnetically and assigned to electrical terminals of the semiconductor component; and a contacting unit comprising electrical traces providing an electrically conductive connection of the semiconductor component to the filter, a thickness of the circuit being less than approximately 2 mm.

16. The circuit of claim 15, wherein a thickness of the circuit is less than approximately 1.6 mm.

17. The circuit of claim 15, wherein a thickness of the circuit is less than approximately 1.2 mm.

18. The circuit of claim 15, wherein each coil element is a surface-mount device.

19. A circuit comprising:

at least one semiconductor component;

at least one filter comprising two parallel-coupled resonant circuits, the resonant circuits comprising at least two discrete coil elements that each comprises a width, the resonant circuits being disposed adjacent to one another with parallel aligned magnetic field axes; and a contacting unit comprising electrical traces providing an electrically conductive connection of the semiconductor component to the filter, the semiconductor component residing without a housing on the contacting unit, the coil elements being disposed with a spacing from each other of approximately 1 to approximately 2.5 times the width of the coil elements.

20. The circuit of claim 19, wherein the coil elements are disposed with a spacing from each other of approximately 1.5 times the width of the coil elements.

21. The circuit of claim 19, wherein each coil element is a surface-mount device.

* * * * *